US012804942B2

(12) United States Patent
Song et al.

(10) Patent No.: US 12,804,942 B2
(45) Date of Patent: Nov. 17, 2026

(54) POWER SEMICONDUCTOR DEVICE, POWER SEMICONDUCTOR MODULE, POWER CONVERTER INCLUDING SAME, AND MANUFACTURING METHOD THEREOF

(71) Applicant: LX Semicon Co., Ltd., Daejeon (KR)

(72) Inventors: Seungwook Song, Daejeon (KR); Namju Kang, Daejeon (KR); Jinok Park, Daejeon (KR); Doohyung Lee, Daejeon (KR); Chaedeok Lee, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 430 days.

(21) Appl. No.: 18/238,057

(22) Filed: Aug. 25, 2023

(65) Prior Publication Data

US 2025/0022949 A1 Jan. 16, 2025

(30) Foreign Application Priority Data

Jul. 13, 2023 (KR) ........................ 10-2023-0091366

(51) Int. Cl.
*H10D 30/66* (2025.01)
*H02M 7/537* (2006.01)
(Continued)

(52) U.S. Cl.
CPC ............ *H10D 30/66* (2025.01); *H02M 7/537* (2013.01); *H10D 30/0291* (2025.01); *H10P 30/22* (2026.01)

(58) Field of Classification Search
CPC ... H10D 30/66; H10D 30/0291; H10D 64/516
See application file for complete search history.

(56) References Cited

U.S. PATENT DOCUMENTS

2013/0181280 A1* 7/2013 Sdrulla ................ H10D 30/025 257/329
2013/0256698 A1 10/2013 Sdrulla et al.
(Continued)

FOREIGN PATENT DOCUMENTS

WO 2022047349 A2 3/2022

OTHER PUBLICATIONS

Extended European Search Report dated Jan. 29, 2024 issued in Patent Application No. 23190626.4 (10 pages).

*Primary Examiner* — Michele Fan
(74) *Attorney, Agent, or Firm* — POLSINELLI PC

(57) ABSTRACT

A power semiconductor device includes a substrate, a first conductivity type epitaxial layer disposed on the substrate, a second conductivity type well partially disposed on the first conductivity type epitaxial layer, a second conductivity type ion implantation region partially disposed in the second conductivity type well, a source region partially disposed in the second conductivity type well and disposed on the second conductivity type ion implantation region, a gate insulating layer disposed on the source region and the second conductive type well, a gate disposed on the gate insulating layer, an interlayer insulating layer disposed on the gate, and a source electrode disposed on the source region. The gate insulating layer may include a channel gate insulating layer having a first thickness and a protruding gate insulating layer having a second thickness thicker than the first thickness, A concentration in a Rb region which is a lateral resistance of the second conductivity type ion implantation region may be higher than that of the second conductivity type well.

8 Claims, 8 Drawing Sheets

(51) Int. Cl.
*H10D 30/01* (2025.01)
*H10P 30/22* (2026.01)

(56) References Cited

U.S. PATENT DOCUMENTS

2013/0313570 A1 11/2013 Sdrulla et al.
2016/0104792 A1 4/2016 Banerjee et al.
2020/0295174 A1 * 9/2020 Sabri ...................... H10D 30/66

* cited by examiner

POWER SEMICONDUCTOR DEVICE, POWER SEMICONDUCTOR MODULE, POWER CONVERTER INCLUDING SAME, AND MANUFACTURING METHOD THEREOF

CROSS-REFERENCE TO RELATED APPLICATION

The present application claims the priority of Korean Patent Application No. 10-2023-0091366, filed on Jul. 13, 2023, which is hereby incorporated by reference in its entirety.

BACKGROUND

Field of the Disclosure

The present disclosure relates to a power semiconductor device, a power semiconductor module, a power converter, and a manufacturing method thereof.

DESCRIPTION OF THE BACKGROUND

Power semiconductors are one of the key factors that determine the efficiency, speed, durability and reliability of power electronic systems.

With the recent development of the power electronics industry, as the previously used silicon (Si) power semiconductors reach their physical limits, research on WBG (Wide Bandgap) power semiconductors such as silicon carbide (SiC) and gallium nitride (GaN) to replace Si power semiconductors is being actively conducted.

WBG power semiconductor devices have bandgap energy about 3 times that of Si power semiconductor devices, resulting in low intrinsic carrier concentration, high dielectric breakdown field (about 4 to 20 times), and high thermal conductivity (about 3 to 13 times) and a large electron saturation rate (about 2 to 2.5 times).

Due to these characteristics, it may operate in a high-temperature, high-voltage environment and has high switching speed and low switching loss. Among them, a gallium nitride (GaN) power semiconductor device may be used for a low voltage system, and a silicon carbide (SiC) power semiconductor device may be used for a high voltage system.

SiC MOSFETs of related art may be classified into a trench structure MOSFET, a vertical doubly implanted structure MOSFET (DIMOSFETs), or a lateral diffused structure MOSFET, etc., depending on the structure. The DIMOSFET is also called Planar MOSFET or VDMOSFET.

On the other hand, power MOSFETs need to have low conduction loss and low switching loss characteristics. Also, power MOSFETs need to be stable enough to prevent the parasitic bipolar device from operating under high current conditions such as unclamped inductive switching (UIS) condition.

Power MOSFET devices tend to lose stability under UIS condition because the parasitic NPN bipolar operates when high inductive currents are present in the device. This causes a temperature rise and a voltage drop in the internal base resistance (Rb) which may cause serious damage.

In addition, when UIS occurs, rapid voltage and current spikes occur inside the device, which may cause destruction of the power semiconductor device.

Therefore, UIS is one of the important issues to be considered in design and manufacture of power semiconductor devices.

In internal MOSFET technology, a stepped gate insulating layer has been studied to improve switching loss characteristics. The stepped gate insulating layer structure is a structure in which a thick insulating layer is disposed in a region except for the P-well where a channel may be formed, and through this, the switching loss characteristic may be improved by reducing the oxide capacitance Cgd formed between the gate and the drain.

However, in the DIMOSFET provided with the stepped gate insulating layer of the internal technology, there is a problem that the di/dt change amount increases and UIS characteristics deteriorate.

That is, there is a problem of technical contradiction in that when internal technology adopts the stepped insulation layer structure to improve switching loss characteristics, rapid voltage and current spikes occur as the UIS characteristics of the power MOSFET device deteriorate, resulting in destruction of the power semiconductor device.

The above information disclosed in this Background section is only for enhancement of understanding of the background of the described technology and therefore it may contain information that does not form prior art that is already known to a person of ordinary skill in the art.

SUMMARY

Accordingly, the present disclosure is directed to a method for observing a power semiconductor device, a power semiconductor module, a power converter, and a manufacturing method thereof that substantially obviate one or more of problems due to limitations and disadvantages described above.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a power semiconductor device and a power converter including the same capable of solving technical contradiction in that when internal technology adopts the stepped insulation layer structure to improve switching loss characteristics, rapid voltage and current spikes occur as the UIS characteristics of the power MOSFET device deteriorate, resulting in destruction of the power semiconductor device.

The present disclosure is not limited to those described in this section, but include those that may be understood through the description of the disclosure.

To achieve the above and other advantages and in accordance with the present disclosure, as embodied and broadly described, a power semiconductor devices include a substrate, a first conductivity type epitaxial layer disposed on the substrate, a second conductivity type well partially disposed on the first conductivity type epitaxial layer, a second conductivity type ion implantation region partially disposed in the second conductivity type well, a source region partially disposed in the second conductivity type well and disposed on the second conductivity type ion implantation region, a gate insulating layer disposed on the source region and the second conductive type well, a gate disposed on the gate insulating layer, an interlayer insulating layer disposed on the gate, and a source electrode disposed on the source region.

The gate insulating layer may include a channel gate insulating layer having a first thickness and a protruding gate insulating layer having a second thickness thicker than the first thickness, A concentration in a Rb region which is a lateral resistance of the second conductivity type ion implantation region may be higher than that of the second conductivity type well.

The concentration in the Rb region which is the lateral resistance of the second conductivity type ion implantation region may be 90 to 100 times higher than that of the second conductivity type well.

The source electrode may include a protruding source contact electrode disposed in the source region and a recess region of the second conductivity type ion implantation region.

The protruding source contact electrode may be in contact with an upper surface of the source region and a side surface of the source region.

A power converter according to the aspect may include at least one of the power semiconductor devices as above.

In another aspect of the present disclosure, a method for manufacturing a power semiconductor device includes preparing a substrate including a first conductivity type epitaxial layer, forming a first hard mask pattern on the first conductivity type epitaxial layer and forming a second conductive well, forming a second hard mask pattern on a sidewall of the first hard mask pattern, forming a first conductivity type source region by implanting ions into the second conductivity type well using the first hard mask pattern and the second hard mask pattern as an ion implantation mask, forming a third hard mask pattern on the first hard mask pattern and the second hard mask pattern, forming a second conductivity type ion implantation region in the second conductivity type well using the first, second, and third hard mask patterns as self-aligned ion implantation mask, removing the first, second, and third hard mask patterns, and sequentially forming a gate insulating layer, a gate, and an interlayer insulating layer on the source region and the second conductive well.

In a further aspect of the present disclosure, a power semiconductor device includes a first conductivity type epitaxial layer disposed on a substrate; a second conductivity type well disposed on the first conductivity type epitaxial layer; a second conductivity type ion implantation region disposed in the second conductivity type well; a source region disposed on the second conductivity type ion implantation region in the second conductivity type well; a recess disposed between two adjacent source regions located between first and second gates and reaching an upper portion of the second conductivity type ion implantation region; and a source electrode filled in the recess to contact the second conductivity type ion implantation region, wherein the second conductivity type ion implantation region has a lateral length at least the same as a total length of the two adjacent source regions and the recess in a cross-sectional view.

Forming the second conductivity type ion implantation region may ion implant using the first, second, and third hard mask patterns as the ion implantation mask in a self-aligned manner and form the first conductivity type source region in the second conductivity type well through the second conductivity type ion implantation region.

The second conductivity type ion implantation region may be arranged to surround an area under the source region.

A concentration in the Rb region which is a lateral resistance of the second conductivity type ion implantation region may be higher than that of the second conductivity type well.

A concentration in the Rb region which is a lateral resistance of the second conductivity type ion implantation region may be 90 to 100 times higher than that of the second conductivity type well.

The gate insulating layer may include a channel gate insulating layer having a first thickness and a protruding gate insulating layer having a second thickness thicker than the first thickness.

Further the method for manufacturing the power semiconductor device according to the aspect may include forming a source electrode on the source region after patterning the layers disposed on upper sides thereof.

The source region may include a protruding source contact electrode disposed in the source region and a recess region of the second conductivity type ion implantation region.

The protruding source contact electrode may be contact with an upper surface of the source region and a side surface of the source region.

Technical effects of the power semiconductor and the power converter including the same according to the aspect may include any of the following.

According to the aspect, there are technical effects of providing a power semiconductor device and a power converter including the same capable of solving technical contradiction in that when internal technology adopts the stepped insulation layer structure to improve switching loss characteristics, rapid voltage and current spikes occur as the UIS characteristics of the power MOSFET device deteriorate, resulting in destruction of the power semiconductor device.

For example, the gate insulating layer may include a channel gate insulating layer and a protruding gate insulating layer such that thick protruding gate insulating layer may be disposed in an area other than a P-well where a channel may be formed. Accordingly, switching loss characteristics of the device may be improved by reducing the value of Miller Capacitance (Cgd) associated with the switching speed by reducing an oxide capacitance (Cgd) formed between the gate and the drain.

At the same time, according to the aspect, alignment accuracy in which the second conductivity type ion implantation region is disposed below the source region may be significantly improved. Accordingly, by lowering the Rb resistance, there is a special technical effect that may solve the technical contradiction of deteriorating the UIS characteristics.

For example, in the aspect, after depositing a CVD (chemical vapor deposition) film of a certain thickness in a self-align structure for the source region, the second conductivity type ion implantation region may be ion implanted by self-align.

For example, in the aspect, the second conductivity type ion implantation region may be formed under the source region in a self-aligned method by strongly implanting ions after depositing an insulating layer having a certain thickness, rather than using a photo method. Through this, it is possible to form the second conductivity type ion implantation region thinly surrounding the source region while guaranteeing the thickness of the second conductivity type well which is P-body to withstand the internal pressure.

Accordingly, the aspect may be controlled so that the second conductivity type ion implantation region may finely surround the area under the source region, compared to the related photo align method, and Rb (i.e., internal base resistance) which is related to the operation of the parasitic NPN BJT (i.e., bipolar junction transistor) may be dramatically lowered.

For example, in the internal technology, the concentration of Rb has a concentration similar to that of the second conductivity type well, which is the second conductivity type body. However, according to the aspect, the concentration of Rb may be similar to that of the second conductivity type ion implantation region. Accordingly, the aspect has a special technical effect of improving the UIS characteristics by suppressing the operation of the parasitic NPN BJT by drastically lowering the Rb resistance by having a higher concentration than the related art.

For example, according to the aspect, the Rb resistance may be drastically lowered by having a concentration similar to that of the second conductivity type ion implantation region 114 and having a concentration 10 times higher than that of the related art.

In addition, according to the aspect, the Rb resistance may be drastically lowered by having a concentration similar to that of the second conductivity type ion implantation region and having a concentration 30 times higher than that of the related art.

In addition, according to the aspect, the Rb resistance may be drastically lowered by having a concentration similar to that of the second conductivity type ion implantation region 114 and having a concentration 50 times higher than that of the related art.

For example, according to the aspect, the Rb concentration may be 90 to 100 times higher than the related art by having a similar concentration to that of the second conductivity type ion implantation region, thereby dramatically reducing Rb resistance. So, there is a special technical effect that the UIS characteristics may be improved by suppressing the operation of the parasitic NPN BJT.

In addition, in the internal technology, only the self-aligned structure for the source region was possible, but in the aspect, ion implantation is possible up to the second conductive type ion implantation region in a self-aligned manner. Accordingly, the degree of freedom of contact alignment of a subsequent process may be increased, there is a technical effect of significantly increasing the cell density and improving the Ron characteristics.

The source electrode may include a protruding source contact electrode having a body contact shape disposed in the source region and a recessed region of the second conductivity type ion implantation region. The protruding source contact electrode may contact a top surface of the source region and a side surface of the source region such that there is a complex technical effect that the contact area is widened and the Ron characteristics are improved.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Hereinafter, the disclosure according to an aspect for solving the above problems will be described in more detail with reference to the drawings.

The suffixes "module" and "unit" for the elements used in the following description are simply given in consideration of ease of writing this specification, and do not themselves give a particularly important meaning or role. Accordingly, the "module" and "unit" may be used interchangeably.

Terms including ordinal numbers, such as first and second, may be used to describe various elements, but the elements are not limited by the terms. These terms are only used for the purpose of distinguishing one element from another.

Singular expressions include plural expressions unless the context clearly dictates otherwise.

In this application, terms such as "comprise", "have" or "include" are intended to designate that there is a feature, number, step, operation, component, part, or combination thereof described in the specification, and it is not precluded from being excluded one or other features, numbers, steps, operations, components, parts, or combinations thereof, or any combination thereof.

Figure 1:
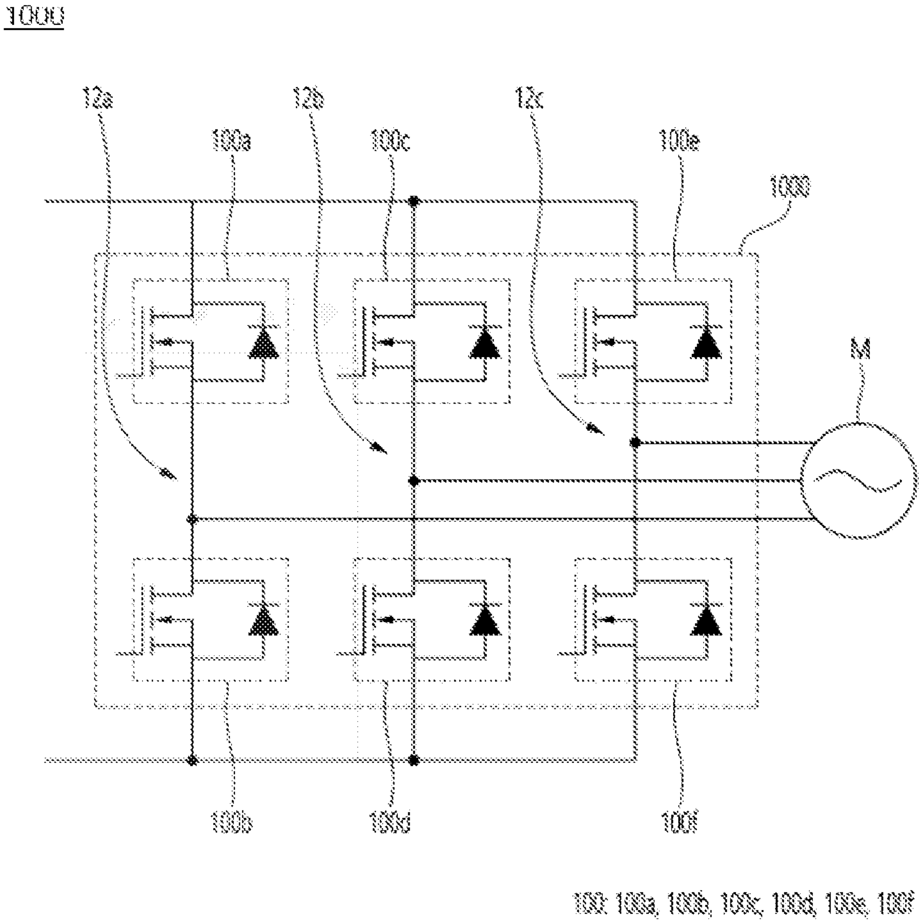
FIG. 1 is an exemplary view of a power converter according to an aspect of the present disclosure.

FIG. 1 is an exemplary view of a power converter 1000 according to an aspect of the present disclosure.

The power converter 1000 may receive DC power from a battery or fuel cell, convert it into AC power, and supply the AC power to a predetermined load. For example, the power converter 1000 according to the aspect of the present disclosure may include an inverter, which receive DC power from a battery, convert the DC power into 3-phase AC power, and supply the 3-phase AC power to a motor M. The motor M may provide power to electric vehicles or fuel cell vehicles.

The power converter 1000 according to the aspect of the present disclosure may include a plurality of power semiconductor devices. The power semiconductor devices may be a metal oxide semiconductor field effect transistor (MOSFET), but is not limited thereto, and may include an insulated gate bipolar transistor (IGBT).

For example, the power converter 1000 may include the plurality of power semiconductor devices **100*a*, 100*b*, 100*c*, 100*d*, 100*e*, and 100*f*, and may include a plurality of diodes (not shown). Each of the plurality of diodes may be internally incorporated in each of the power semiconductor devices 100a, 100b, 100c, 100d, 100e, and 100**f in the form of an internal diode, but is not limited thereto, and may be disposed separately.

In the aspect of the present disclosure, DC power may be converted into AC power through on-off control of the plurality of power semiconductor devices 100a to 100f.

For example, in the power converter 1000, the first power semiconductor device 100a may be turned on and the second power semiconductor device 100b may be turned off in a first time period of one cycle to supply positive polarity power to the motor M.

In the second time period of one cycle, the first power semiconductor device 100a may be turned off and the second power semiconductor device 100b may be turned on to supply negative polarity power to the motor M.

In the aspect, a group of power semiconductor devices disposed in series in a high voltage line and a low voltage line of an input side may be referred to as an arm.

For example, the first power semiconductor device 100a and the second power semiconductor device 100b may constitute a first arm 12a, and the third power semiconductor device 100c and the fourth power semiconductor device 100d may constitute a second arm 12b. The fifth power semiconductor device 100e and the sixth power semiconductor device 100f may constitute a third arm 12c.

In the arms, an upper side power semiconductor device and a lower side power semiconductor device may be controlled not to turn on at the same time. For example, in the first arm, the first power semiconductor device 100a and the second power semiconductor device 100b do not simultaneously turn on, but may turn on and off alternately.

Each of the power semiconductor devices 100a to 100f may receive high power in an off state. For example, when the second power semiconductor device 100b is turned off while the first power semiconductor device 100a is turned on, the input voltage may be applied to the second power semiconductor device 100b as it is. The voltage input to the second power semiconductor device 100b may be a relatively high voltage, and a withstand voltage of each power semiconductor device 100a to 100f may be designed to have a high level to withstand such a high voltage.

Each of the power semiconductor devices 100a to 100f may conduct a high current in a turn on state. The motor M may be driven with a relatively high current, and this high current may be supplied to the motor M through a power semiconductor that is turned on.

A high voltage applied to each of the power semiconductor devices 100a to 100f may cause a high switching loss. A high current conducting the power semiconductor devices 100a to 100f may cause a high conduction loss. To dissipate heat generated by such switching loss or conduction loss, the power semiconductor devices 100a to 100f may be packaged as a power semiconductor module including a heat dissipation means.

The power semiconductor device 100 of the aspect may be a silicon carbide (SiC) power semiconductor device, may operate in a high-temperature, high-voltage environment, and may have a high switching speed and low switching loss.

Meanwhile, the power converter 1000 according to the aspect may include a plurality of power semiconductor modules.

For example, the plurality of power semiconductor devices 100a to 100f shown in FIG. 1 may be packaged into one power semiconductor module, or the power semiconductor devices constituting each arm may be packaged into one power semiconductor module.

For example, the first power semiconductor device 100a, the second power semiconductor device 100b, the third power semiconductor device 100c, the fourth power semiconductor device 100d, and the fifth power semiconductor device 100e and the sixth power semiconductor device 100f shown in FIG. 1 may be packaged into one power semiconductor module.

In addition, there may be additional power semiconductor devices disposed in parallel with each of the power semiconductor devices 100a to 100f to increase a current capacity. In this case, the number of power semiconductor devices included in the power semiconductor module may be greater than six.

The power converter 1000 according to the aspect may include a diode-type power semiconductor device in addition to the transistor-type power semiconductor devices 100a to 100f. For example, a first diode (not shown) may be disposed in parallel with the first power semiconductor device 100a, and a second diode (not shown) may be disposed in parallel with the second power semiconductor device 100b. Also, these diodes may be packaged together in one power semiconductor module. In addition, the diode may be disposed in the form of an internal diode in each power semiconductor device.

Next, the power semiconductor devices constituting each arm may be packaged into one power semiconductor module.

For example, the first power semiconductor device 100a and the second power semiconductor device 100b constituting the first arm may be packaged as a first power semiconductor module. The third power semiconductor device 100c and the fourth power semiconductor device 100d constituting the second arm may be packaged into a second power semiconductor module. And the fifth power semiconductor device 100e and the sixth power semiconductor device 100f constituting the third arm may be packaged into a third power semiconductor module.

In addition, there may be additional power semiconductor devices arranged in parallel with each power semiconductor device 100a to 100f to increase a current capacity. In this case, the number of power semiconductor devices included in each power semiconductor module may be more than two. Also, each arm may include a diode-type power semiconductor device (not shown) in addition to the transistor-type power semiconductor devices 100a to 100f, and these diodes may also be packaged together in one power semiconductor module. In addition, the diode may be disposed in a form of an internal diode in each power semiconductor device.

Figure 2:
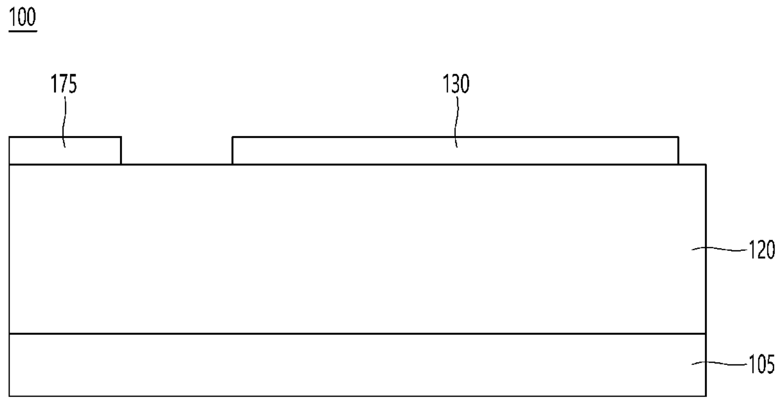
FIG. 2 is a cross-sectional view of a power semiconductor device according to an aspect of the present disclosure.

Next, FIG. 2 is a cross-sectional view of one of the power semiconductor devices shown in FIG. 1.

The power semiconductor device 100 according to the aspect of the present disclosure may include a source electrode 190 disposed above a semiconductor epitaxial layer 120, a gate electrode 175, and a drain electrode 105 disposed below the semiconductor epitaxial layer 120.

In the form of a MOSFET, the source electrode 130 or the gate electrode 175 may include an Al-based metal, and the drain electrode 105 may include Ti/Ni/Ag metal including a Ti layer, a Ni layer, or an Ag layer, or NiV/Ag, V (vanadium)/Ni/Ag, or the like, but is not limited thereto.

The present disclosure is to provide a power semiconductor device and a power converter including the same capable of solving technical contradiction in that when internal technology adopts the stepped insulation layer structure to improve switching loss characteristics, rapid voltage and current spikes occur as the UIS (i.e., unclamped inductive switching) characteristics of the power MOSFET device deteriorate, resulting in destruction of the power semiconductor device.

First, the power semiconductor device according to the internal technology will be described.

To improve switching loss characteristics in internal MOSFET technology, a study was conducted in which a stepped gate insulating layer. The stepped gate insulating layer may include a thick insulating layer in the area except for the P-well where the channel may be formed. The stepped gate insulating layer may improve switching loss characteristics by reducing oxide capacitance Cgd formed between the gate and the drain.

However, in DIMOSFET with the stepped gate insulating layer of internal technology, there is a problem in that the amount of change in di/dt increases and UIS characteristics deteriorate, resulting in rapid voltage and current spikes that cause destruction of power semiconductor devices.

Specifically, in the DIMOSFET provided with the stepped gate insulating layer, a P-Type region may be formed based on a photo process under the N+ contact region which is the source region.

However, the problem of increasing Rb resistance related to the operation of the parasitic NPN BJT has been studied due to the difficulty in aligning the P-Type area immediately below the N+ contact area. Rb resistance means the lateral resistance of the opposite polarity P-Type area immediately below the N+ contact.

Accordingly, in the DIMOSFET internal technology with the stepped gate insulating layer, the di/dt change amount increases due to the problem of increasing Rb resistance, and the UIS characteristic deteriorates, resulting in rapid voltage and a current spike. So, there is a technical problem that causes destruction of the power semiconductor device.

Hereinafter, a power semiconductor device 100 according to an aspect for solving the above technical problem will be described.

Figure 3A:
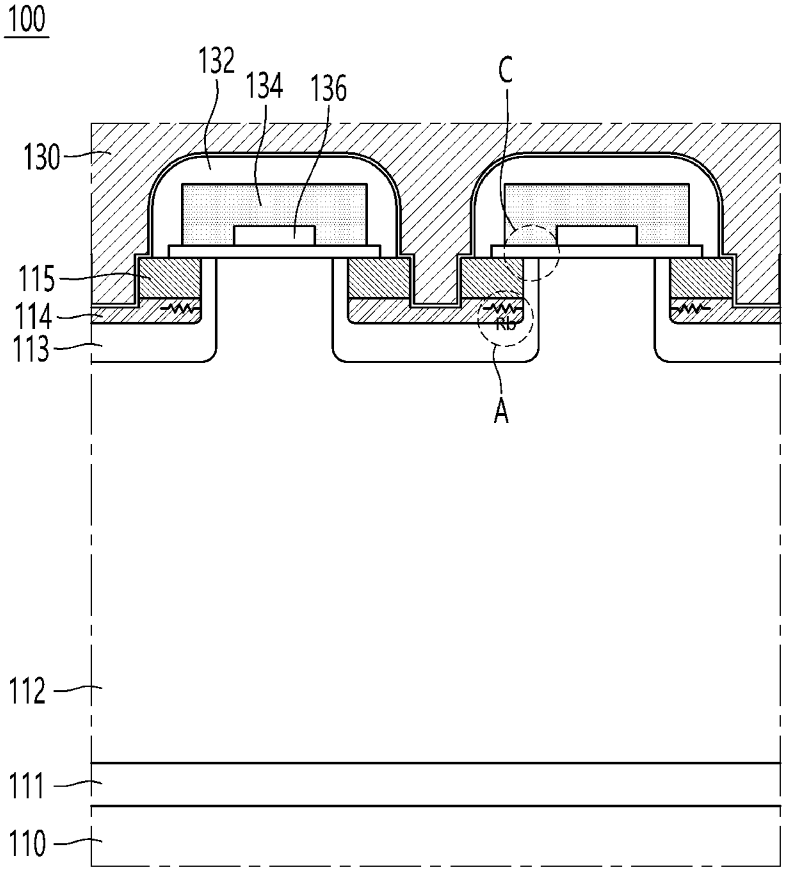
FIG. 3A is a cross-sectional view of a power semiconductor device according to an aspect of the present disclosure.
Figure 3B:
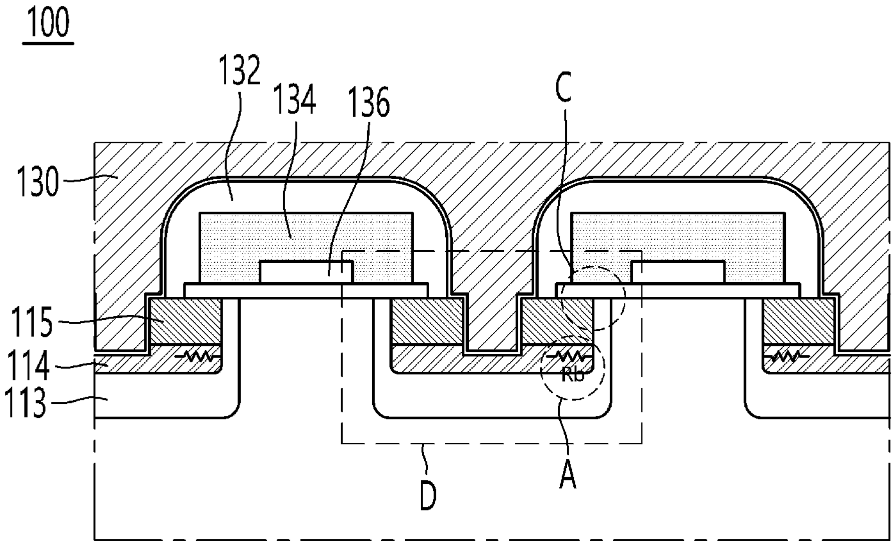
FIG. 3B is a partial view of a cross-sectional view of the power semiconductor device shown in FIG. 3A.

FIG. 3A is a cross-sectional view of a power semiconductor device 100 according to an aspect of the present disclosure, and FIG. 3B is a partial view of a cross-sectional view of the power semiconductor device 100 shown in FIG. 3A.

Initially referring to FIG. 3A, the power semiconductor device 100 according to the aspect of the present disclosure may include at least one of a drain electrode 110, a substrate 111, a first conductivity type epitaxial layer 112, a second conductive well 113, and a second conductive type epitaxial layer 112, a conductive ion implantation region 114, a first conductive source region 115, a gate insulating layer 136, a gate 134, an interlayer insulating layer 132, and a source electrode 130.

The first conductivity type may be N-type, and the second conductivity type may be P-type, but is not limited thereto. The substrate 111 and the first conductivity type epitaxial layer 112 may include silicon carbide (SiC), but are not limited thereto.

Specifically, the power semiconductor device 100 according to the aspect may include a substrate 111, a first conductivity type epitaxial layer 112 disposed on the substrate 111, a second conductivity type well 113 partially disposed on first conductivity type epitaxial layer 112, a second conductivity type ion implantation region 114 partially disposed on the second conductivity type well 113 and a source region 115 partially disposed in the second conductivity type well 113 and disposed on the second conductivity type ion implantation region 114.

In addition, the power semiconductor device 100 according to the aspect may include a gate insulating layer 136 disposed on the source region 115 and the second conductive well 113, and a gate 134 disposed on the gate insulating layer 136, an interlayer insulating layer 132 disposed on the gate 134, and a source electrode 130 disposed on the source region 115. A predetermined channel C may be defined between the gate 134 and the source region 115.

Hereinafter, detailed features of the power semiconductor device 100 according to the aspect of the present disclosure will be described in detail with reference to FIGS. 3B and 4.

Figure 4:
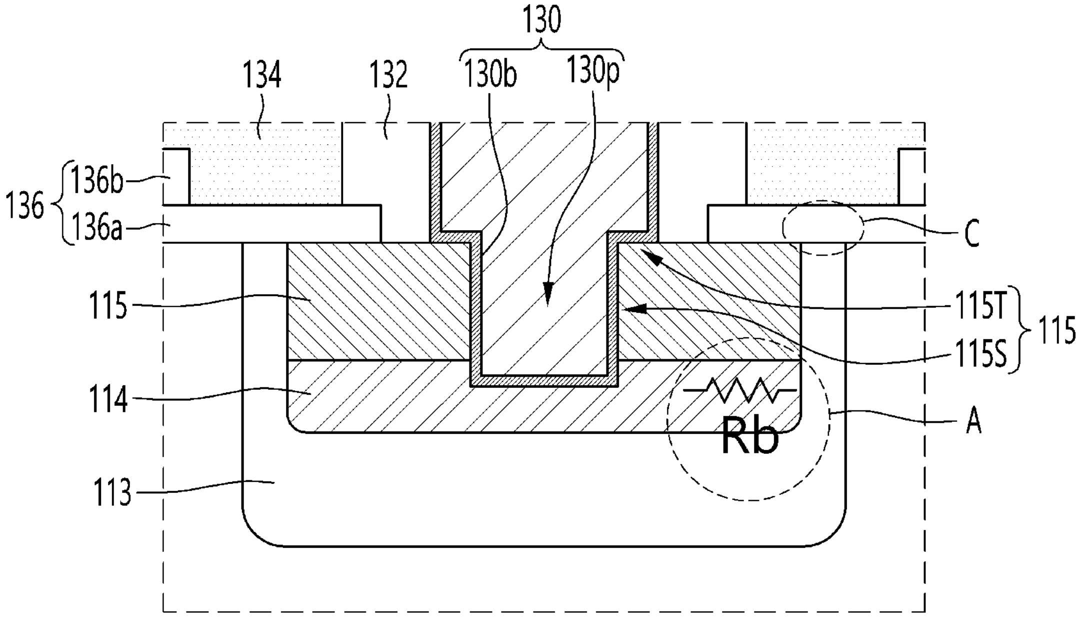
FIG. 4 is a detailed view of region D of a cross-sectional view of the power semiconductor device shown in FIG. 3B.

FIG. 3B is a partial view of a cross-sectional view of the power semiconductor device 100 shown in FIG. 3A, and FIG. 4 is a detailed cross-sectional view of region D of the power semiconductor device 100 shown in FIG. 3B.

According to the aspect of the present disclosure, the power semiconductor device and the power converter including the same is capable of solving problems in that when internal technology adopts the stepped insulation layer structure to improve switching loss characteristics, rapid voltage and current spikes occur as the UIS characteristics of the power MOSFET device deteriorate, resulting in destruction of the power semiconductor device.

For example, referring to FIG. 4, 0 the gate insulating layer 136 may include a channel gate insulating layer 136*a* and a protruding gate insulating layer 136*b* such that a thick protruding gate insulating layer 136*b* may be disposed in an area other than a P-well where a channel may be formed. Accordingly, switching loss characteristics of the device may be improved by reducing the value of Miller Capacitance (Cgd) associated with the switching speed by reducing an oxide capacitance (Cgd) formed between the gate and the drain.

At the same time, according to the aspect of the present disclosure, @ an alignment accuracy in which the second conductivity type ion implantation region 114 is disposed below the source region 115 can be significantly improved. Accordingly, by lowering the Rb resistance (region A), deteriorating the UIS characteristics can be improved.

For example, after depositing a CVD film of a certain thickness in a self-align structure for the source region 115, the second conductivity type ion implantation region 114 may be ion implanted by a self-aligned method.

The second conductivity type ion implantation region 114 may be formed under the source region 115 in the self-aligned method by implanting ions after depositing an insulating layer having a certain thickness, rather than using a photo method. Through this, it is possible to form the second conductivity type ion implantation region 114 thinly surrounding the source region 115 while guaranteeing the thickness of the second conductivity type well 113 which is P-body to withstand the internal pressure.

Accordingly, the second conductivity type ion implantation region 114 may finely surround the area under the source region 115, compared to the related photo align method, and Rb (internal base resistance) which is related to the operation of the parasitic NPN BJT can be dramatically lowered.

For example, in the internal technology, the concentration of Rb has a concentration similar to that of the second conductivity type well 113, which is the second conductivity type body. However, according to the aspect of the present disclosure, the concentration of Rb may be similar to that of the second conductivity type ion implantation region 114. Accordingly, the aspect of the resent disclosure can improve the UIS characteristics by suppressing the operation of the parasitic NPN BJT by lowering the Rb resistance by having a higher concentration than the known art.

In addition, in the internal technology, only the self-aligned structure for the source region 115 was possible, but in the aspect of the present disclosure, ion implantation is possible up to the second conductive type ion implantation region 114 in the self-aligned method. Accordingly, the degree of freedom of contact alignment of a subsequent process can be increased, thereby significantly increasing the cell density and improving the Ron characteristics.

Also, in an aspect of the present disclosure, the source electrode 130 may include a barrier metal layer 130*b* and a protruding source contact electrode 130*p*.

The source electrode 130 of the aspect may include a protruding source contact electrode 130*p* having a body contact shape disposed in the source region 115 and a recessed region of the second conductivity type ion implantation region 114. The protruding source contact electrode 130*p* may contact a top surface 115T of the source region and a side surface 115S of the source region such that there is a complex technical effect that the contact area is widened and the Ron characteristics are improved.

Next, a manufacturing process of the power semiconductor device 100 according to the aspect will be described with reference to FIGS. 5A to 5H.

Figure 5A:
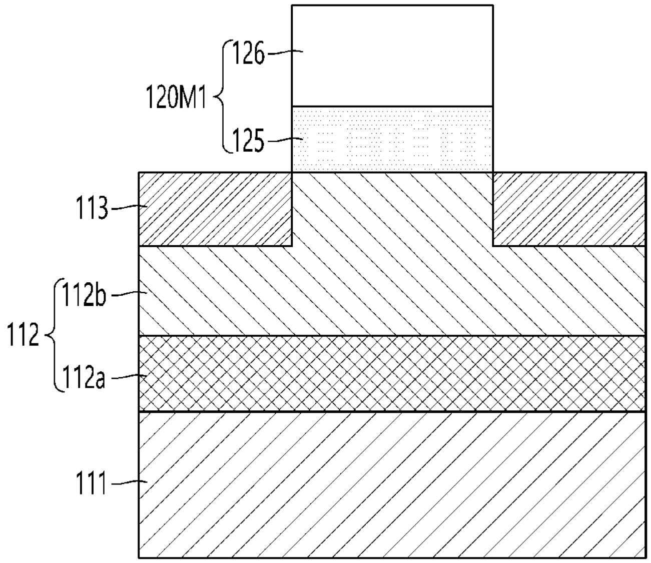
FIGS. 5A to 5H are cross-sectional views of a manufacturing process of a power semiconductor device according to an aspect of the present disclosure.

Referring to FIG. 5A, a substrate 111 including a first conductivity type epitaxial layer 112 may be prepared. The first conductivity type epitaxial layer 112 may include a first conductivity type buffer layer 112*a* and a first conductivity type drift layer 112*b*.

The substrate 111 and the first conductivity type epitaxial layer 112 may include a 4H—SiC material, but is not limited thereto. For example, the substrate 111 and the first conductivity type epitaxial layer 112 may include 3C—SiC or 6H—SiC.

Next, a second conductivity type well 113 may be formed in the first conductivity type epitaxial layer 112.

For example, a first hard mask pattern 120M1 may be formed on the first conductivity type epitaxial layer 112, and ions are implanted using the first hard mask pattern 120M1 as a mask to form a second conductive well 113. The second conductivity type well 113 may be a P type body, but is not limited thereto.

The first hard mask pattern 120M1 may include a polysilicon pattern 125 and an oxide pattern 126, but are not limited thereto.

The second conductive type well 113 may be ion-implanted with a P-type dopant at a concentration of about $1\times10^{16}$ $cm^{-3}$ to about $2\times10^{19}$ $cm^{-3}$. For example, Al or boron may be implanted, but is not limited thereto.

Figure 5B:
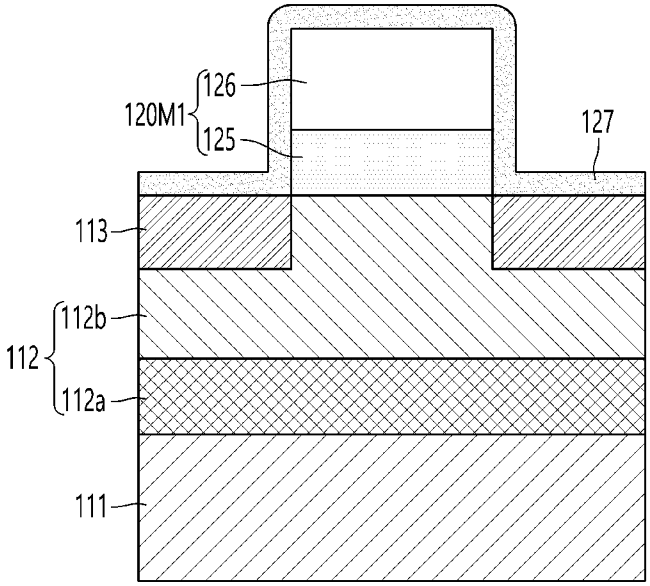
Figure 5C:
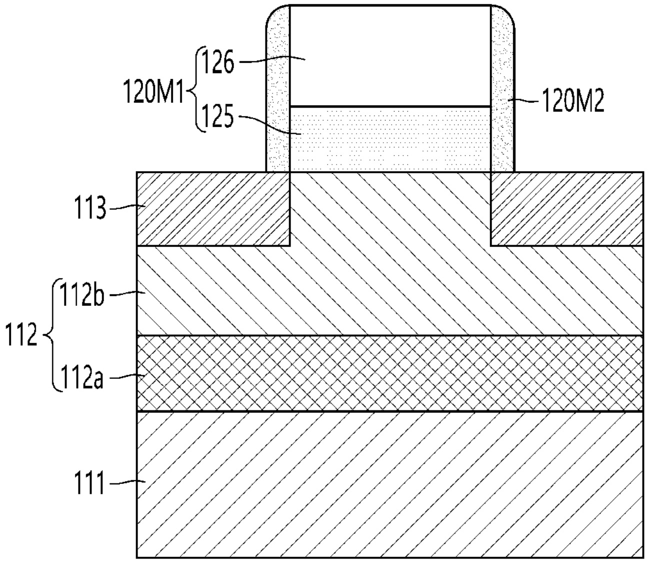

Next, referring to FIG. 5B, a second hard mask preliminary layer 127 may be formed on the first hard mask pattern 120M1 and etched back to form the second hard mask pattern 120M2 as shown in FIG. 5C. The second hard mask pattern 120M2 may be formed on the sidewall of the hard mask pattern 120M1. The second hard mask preliminary layer 127 may include polysilicon, but is not limited thereto.

Figure 5D:
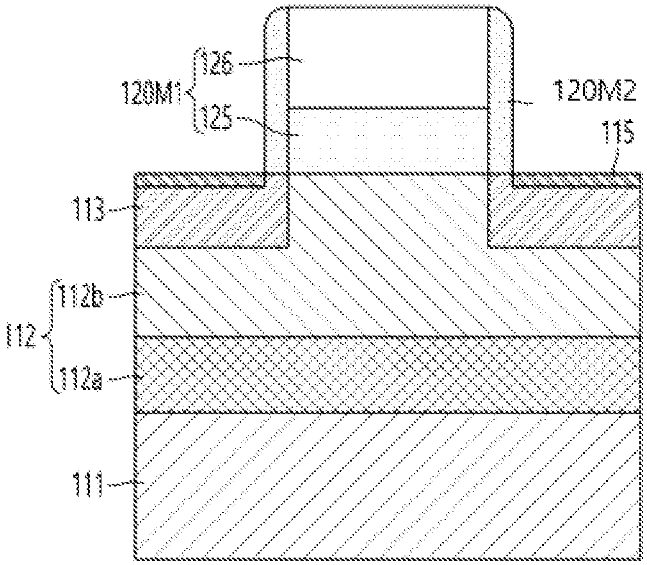

Next, referring to FIG. 5D, a first conductivity type source region 115 may be formed by implanting into the second conductivity type well 113 using the first hard mask pattern 120M1 and the second hard mask pattern 120M2 as an ion implantation mask.

For example, the first conductivity type source region 115 may be formed by ion implanting an N-type dopant such as nitrogen or phosphorus at a concentration of about $1\times10^{18}$ $cm^{-3}$ to about $7\times10^{19}$ $cm^{-3}$ in a self-aligned manner.

Figure 5E:
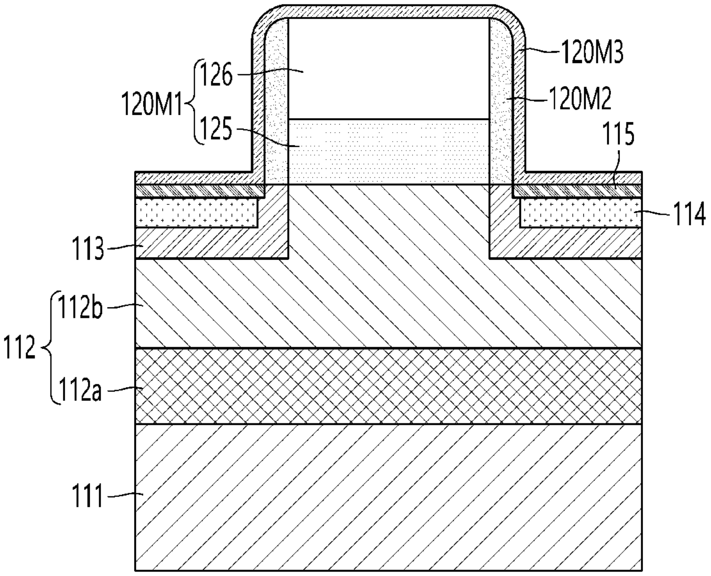

Next, referring to FIG. 5E, a third hard mask pattern 120M3 may be formed on the first hard mask pattern 120M1 and the second hard mask pattern 120M2.

For example, the third hard mask pattern 120M3 may be formed of oxide on the upper surface of the first hard mask pattern 120M1, the sidewall of the second hard mask pattern 120M2, and the first conductive source region 115. However, it is not limited thereto.

Next, a second conductivity type ion implantation region 114 may be formed by ion implanting using the first, second, and third hard mask patterns 120M1, 120M2, and 120M3 as an ion implantation mask in a self-aligned manner.

For example, the second conductivity type ion implantation region 114 may be formed by implanting Al or boron into the second conductivity type well 113 at a deeper location through the first conductivity type source region 115.

In the aspect, instead of using a photo method, an insulating layer having a certain thickness is deposited as the third hard mask pattern 120M3 and the second conductivity type ion implantation region 114 may be formed by strongly ion implanting under the source region 115 in a self-aligned method.

Accordingly, in the aspect, compared to the related photo-alignment method, the second conductivity type ion implantation region 114 may be controlled to finely surround the area under the source region 115, and Rb resistance related to the operation of the parasitic NPN BJT may dramatically be lowered.

For example, in the internal technology, the Rb concentration had a concentration similar to that of the second conductivity type well 113 which is the second conductivity type body. But, according to the aspect, since the concentration of Rb may be similar to that of the second conductivity type ion implantation region 114, the concentration of Rb may have a concentration 90 to 100 times higher than that of the related art. So, the Rb resistance may be drastically lowered, thereby suppressing the operation of the parasitic NPN BJT such that the UIS characteristics may be improved.

In addition, since ions may be implanted not only in the self-aligned both in the source region 115 and in the second conductivity type ion implantation region 114, the degree of freedom in the subsequent process such as contact align may increase. So, there is a technical effect of significantly increasing the cell density, thereby improving the Ron characteristics.

Figure 5F:
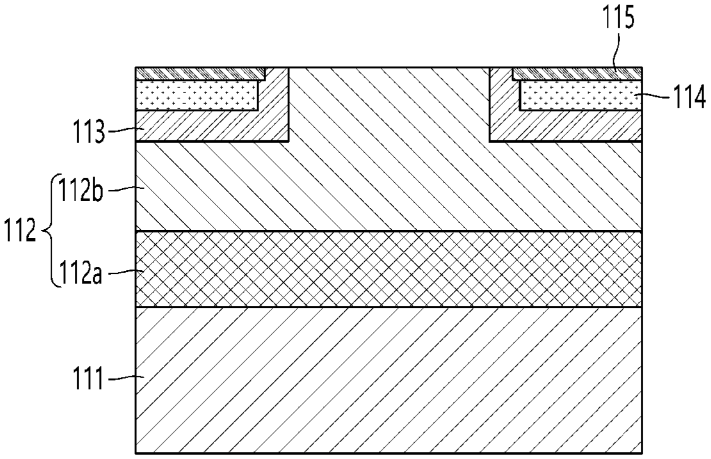

Next, referring to FIG. 5F, the first, second, and third hard mask patterns 120M1, 120M2, and 120M3 may be removed by CMP (chemical mechanical polishing) or etching.

Figure 5G:
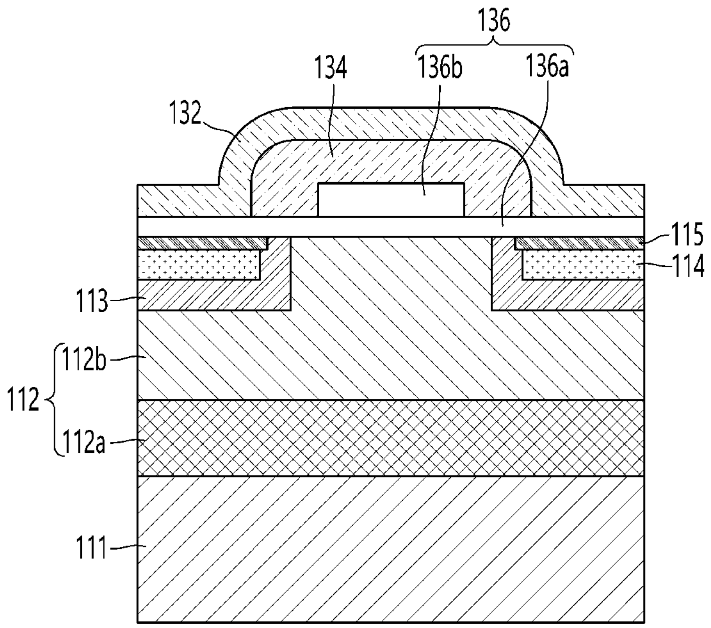

Next, referring to FIG. 5G, a gate insulating layer 136 may be formed on the source region 115 and the second conductive type well 113, and a gate 134 may be formed on the gate insulating layer 136, and an interlayer insulating layer 132 may be formed on the gate 134.

The gate insulating layer 136 may be a thermal oxide layer or a deposition oxide layer, but is not limited thereto. The gate 134 may be formed of polysilicon, but is not limited thereto. The interlayer insulating layer 132 may be formed of an oxide film or a nitride film, but is not limited thereto.

The gate insulating layer 136 may include a channel gate insulating layer 136*a* and a protruding gate insulating layer 136*b*. The aspect may reduce the Oxide Capacitance, Cgd formed between the Gate and Drain by placing the thick protruding gate insulating layer 136*b* in the area except for the P-well where the channel may be formed.

According to the aspect, the Miller Capacitance Cgd value associated with the switching speed may be reduced by reducing the Oxide Capacitance, Cgd such that switching loss characteristics of the device may be improved.

Figure 5H:
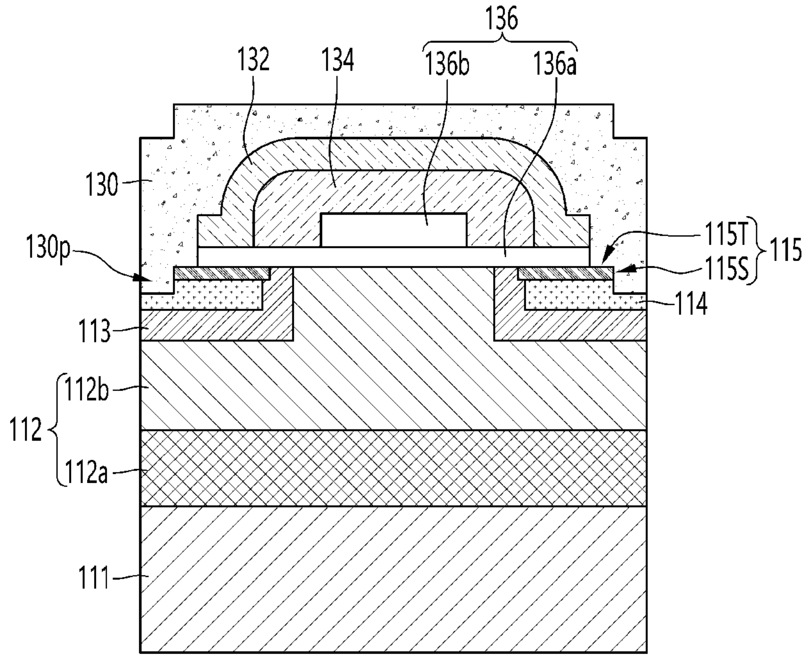

Next, referring to FIG. 5H, the source electrode 130 may be formed on the source region 115 after patterning of the layers disposed on the upper side of the source region 115.

The source electrode 130 may be formed of Al or the like, but is not limited thereto. In addition, the source electrode 130 may further include a barrier metal layer 130*b* (shown in FIGS. 3A, 3B and 4).

The source electrode 130 of the aspect may include a protruding source contact electrode 130*p* having a body contact shape disposed in the source region 115 and the recess region of the second conductivity type ion implantation region 114.

In the aspect, since the protruding source contact electrode 130*p* is in contact with atop surface 115T of the source region and a side surface 115S of the source region, the contact area may be widened, resulting in a complex technical effect of improving Ron characteristics.

According to the aspect, there are technical effects of providing a power semiconductor device and a power converter including the same capable of solving technical contradiction in that when internal technology adopts the stepped insulation layer structure to improve switching loss characteristics, rapid voltage and current spikes occur as the UIS characteristics of the power MOSFET device deteriorate, resulting in destruction of the power semiconductor device.

For example, the gate insulating layer 136 of the aspect may include a channel gate insulating layer 136*a* and a protruding gate insulating layer 136*b* such that thick protruding gate insulating layer 136*b* may be disposed in an area other than a P-well where a channel is formed. Accordingly, switching loss characteristics of the device may be improved by reducing the value of Miller Capacitance (Cgd) associated with the switching speed by reducing an oxide capacitance (Cgd) formed between the gate and the drain.

At the same time, according to the aspect of the present disclosure, alignment accuracy in which the second conductivity type ion implantation region 114 is disposed below the source region 115 may be significantly improved. Accordingly, by lowering the Rb resistance (region A), there is a special technical effect that may solve the technical contradiction of deteriorating the UIS characteristics.

For example, in the aspect, after depositing a CVD film of a certain thickness in a self-align structure for the source region 115, the second conductivity type ion implantation region 114 may be ion implanted by self-align.

For example, in the aspect, the second conductivity type ion implantation region 114 may be formed under the source region 115 in a self-aligned method by strongly implanting ions after depositing an insulating layer having a certain thickness, rather than using a photo method. Through this, it is possible to form the second conductivity type ion implantation region 114 thinly surrounding the source region 115 while guaranteeing the thickness of the second conductivity type well 113 which is P-body to withstand the internal pressure.

Accordingly, the aspect of the present disclosure may be controlled so that the second conductivity type ion implantation region 114 may finely surround the area under the source region 115, compared to the related photo align method, and Rb (internal base resistance) which is related to the operation of the parasitic NPN BJT may be dramatically lowered.

For example, in the internal technology, the concentration of Rb has a concentration similar to that of the second conductivity type well 113, which is the second conductivity type body. However, according to the aspect, the concentration of Rb may be similar to that of the second conductivity type ion implantation region 114. Accordingly, the aspect has a special technical effect of improving the UIS characteristics by suppressing the operation of the parasitic NPN BJT by drastically lowering the Rb resistance by having a higher concentration than the related art.

In addition, in the internal technology, only the self-aligned structure for the source region 115 was possible, but in the aspect, ion implantation is possible up to the second conductive type ion implantation region 114 in a self-aligned manner. Accordingly, the degree of freedom of contact alignment of a subsequent process may be increased, there is a technical effect of significantly increasing the cell density and improving the Ron characteristics.

Also, in an aspect, the source electrode 130 may include a protruding source contact electrode 130*p* having a body contact shape disposed in the source region 115 and a recessed region of the second conductivity type ion implantation region 114. The protruding source contact electrode 130*p* may contact the top surface 115T of the source region and the side surface 1155 of the source region such that there is a complex technical effect that the contact area is widened and the Ron characteristics are improved.

It will be apparent to those skilled in the art that various modifications and variations can be made in the power semiconductor device, the power semiconductor module, the power converter, and the manufacturing method thereof of the present disclosure without departing from the spirit or scope of the aspects. Thus, it is intended that the present disclosure covers the modifications and variations of the aspects provided they come within the scope of the appended claims and their equivalents.

What is claimed is:

1. A power semiconductor device, comprising:

a first conductivity type epitaxial layer disposed on a substrate;

a second conductivity type well partially disposed on the first conductivity type epitaxial layer;

a second conductivity type ion implantation region partially disposed in the second conductivity type well;

a source region partially disposed in the second conductivity type well and disposed on the second conductivity type ion implantation region;

a gate insulating layer disposed on the source region and the second conductive type well;

a gate disposed on the gate insulating layer;

an interlayer insulating layer disposed on the gate; and a recess disposed between two adjacent source regions located between two adjacent gates, a source electrode disposed on the source region and filled in the recess to contact the second conductivity type ion implantation region, wherein the gate insulating layer comprises a channel gate insulating layer having a first thickness and a protruding gate insulating layer having a second thickness thicker than the first thickness, and wherein the second conductivity type ion implantation region has a higher concentration than that of the second conductivity type well, wherein a bottom surface of the protruding gate insulating layer is disposed on a top surface of the channel gate insulating layer, wherein a side surface of the second conductivity type ion implantation region is vertically aligned with a side surface of the source region, and wherein the source electrode comprises a protruding source contact portion disposed in the recess and contacting the second conductivity type ion implantation region.

2. The power semiconductor device according to claim 1, wherein the concentration of the second conductivity type ion implantation region is 90 to 100 times higher than that of the second conductivity type well.

3. The power semiconductor device according to claim 1, wherein the protruding source contact portion is in contact with an upper surface of the source region and a side surface of the source region.

4. A power converter comprising the power semiconductor device according to claim 1.

5. The power semiconductor device according to claim 4, wherein the source electrode is configured to contact the upper portion of the second conductivity type ion implantation region.

6. The power semiconductor device according to claim 1, wherein the recess reaches an upper portion of the second conductivity type ion implantation region.

7. The power semiconductor device according to claim 6, further comprising a metal barrier layer on the interlayer insulating layer and in the recess.

8. The power semiconductor device according to claim 1, wherein the second conductivity type ion implantation region continuously extends below the source region and electrically couples the source electrode to the second conductivity type well through a reduced-resistance path configured to suppress activation of a parasitic bipolar transistor during unclamped inductive switching (UIS).

* * * * *